(12) United States Patent
Iyer et al.

(10) Patent No.: US 10,816,341 B2
(45) Date of Patent: Oct. 27, 2020

(54) BACKCHANNEL ENCODING FOR VIRTUAL, AUGMENTED, OR MIXED REALITY (XR) APPLICATIONS IN CONNECTIVITY-CONSTRAINED ENVIRONMENTS

(71) Applicant: Dell Products, L.P., Round Rock, TX (US)

(72) Inventors: Vivek Viswanathan Iyer, Austin, TX (US); Michael S. Gatson, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 82 days.

(21) Appl. No.: 16/258,188

(22) Filed: Jan. 25, 2019

(65) Prior Publication Data

US 2020/0240788 A1 Jul. 30, 2020

(51) Int. Cl.
*G01C 21/20* (2006.01)
*G06F 3/01* (2006.01)
*G02B 27/01* (2006.01)
*G06T 19/00* (2011.01)

(52) U.S. Cl.
CPC .......... *G01C 21/20* (2013.01); *G02B 27/017* (2013.01); *G06F 3/011* (2013.01); *G06T 19/006* (2013.01)

(58) Field of Classification Search
CPC ....... G01C 21/20; G02B 27/017; G06F 3/011; G06T 19/006
See application file for complete search history.

(56) References Cited

U.S. PATENT DOCUMENTS

| 2012/0315025 A1* | 12/2012 | Wakamatsu | H04N 5/23258 396/55 |
| 2015/0116316 A1* | 4/2015 | Fitzgerald | G02B 27/017 345/419 |
| 2016/0219241 A1* | 7/2016 | Korneliussen | H04N 19/23 |
| 2017/0103577 A1* | 4/2017 | Mendhekar | G06F 3/011 |
| 2018/0136720 A1* | 5/2018 | Spitzer | G09G 5/391 |
| 2020/0041276 A1* | 2/2020 | Chakravarty | G06T 7/55 |

OTHER PUBLICATIONS

Displaylink, "Wireless VR," 4 pages, retrieved Oct. 19, 2018, available at http://www.displaylink.com/vr.

(Continued)

*Primary Examiner* — Qian Yang
(74) *Attorney, Agent, or Firm* — Fogarty LLP

(57) ABSTRACT

Embodiments of systems and methods for backchannel encoding in virtual, augmented, or mixed reality (xR) applications in connectivity-constrained environments are described. In some embodiments, an Head-Mounted Device (HMD) may include a processor; and a memory coupled to the processor, the memory having program instructions stored thereon that, upon execution by the processor, cause the HMD to: encode each of a plurality of Simultaneous Localization and Mapping (SLAM) landmarks, in part, based upon the SLAM landmark's distance to the HMD; and transmit the encoded SLAM landmarks to an Information Handling System (IHS) coupled to the HMD.

16 Claims, 7 Drawing Sheets

(56) References Cited

OTHER PUBLICATIONS

Steve Lynch, "AMD Acquires Nitero, Maker of 60GHz Wireless Chips for VR/AR Headsets," Virtual Reality News, published Apr. 10, 2017, 4 pages, retrieved Oct. 19, 2018, available at https://www.tomshardware.com/news/amd-acquires-nitero-wireless-vr,34106.html.
Tpcast, "Unleash the VR World," 2 pages, retrieved Oct. 19, 2018, available at https://www.tpcastvr.com/.
Wikipedia, "Audio-to-video synchronization," 5 pages, retrieved Oct. 19, 2018, available at https://en.wikipedia.org/wiki/Audio-to-video_synchronization.
Mark Handley, "13: RTP, A/V Synchronization, Application-level adaptation," 11 pages, retrieved Oct. 19, 2018 available at http://www0.cs.ucl.ac.uk/teaching/GZ05/13-rtp.pdf.
Riisgaard, et al., "SLAM for Dummies", 127 pages, retrieved Oct. 19, 2018, available at https://ocw.mit.edu/courses/aeronautics-and-astronautics/16-412j-cognitive-robotics-spring-2005/projects/1aslam_blas_repo_pdf.
Occipital, "Structure Core Module," published 2018, 5 pages, retrieved Oct. 19, 2018, available at https://occipital.com/.
Robert Collins, "Lecture 12: Camera Projection," 34 pages, retrieved Oct. 19, 2018, available at http://www.cse.psu.edu~rtc12/CSE486/lecture12.pdf.
Michael Bloesch, et al., "CodeSLAM—Learning a Compact, Optimisable Representation for Dense Visual SLAM," published Apr. 3, 2018, 2 pages, publisher Cornell University, retrieved Oct. 19, 2018, available at https://arxiv.org/abs/1804.00874.

\* cited by examiner

BACKCHANNEL ENCODING FOR VIRTUAL, AUGMENTED, OR MIXED REALITY (XR) APPLICATIONS IN CONNECTIVITY-CONSTRAINED ENVIRONMENTS

FIELD

The present disclosure generally relates to Information Handling Systems (IHSs), and, more particularly, to systems and methods for backchannel encoding in virtual, augmented, or mixed reality (xR) applications in connectivity-constrained environments.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs may be used to produce virtual, augmented, or mixed reality (xR) applications. The goal of virtual reality (VR) is to immerse users in virtual environments. A conventional VR device obscures a user's real-world surroundings, such that only digitally-generated images remain visible. In contrast, augmented reality (AR) and mixed reality (MR) operate by overlaying digitally-generated content or entities (e.g., characters, text, hyperlinks, images, graphics, etc.) upon the user's real-world, physical surroundings. A typical AR/MR device includes a projection-based optical system that displays content on a translucent or transparent surface of an HMD, heads-up display (HUD), eyeglasses, or the like (collectively "HMDs").

In various implementations, HMDs may be tethered to an external or host IHS. Most HMDs do not have as much processing capability as the host IHS, so the host IHS is used to generate the digital images to be displayed by the HMD. The HMD transmits information to the host IHS regarding the state of the user, which in turn enables the host IHS to determine which image or frame to show to the user next, and from which perspective, as the user moves in space.

SUMMARY

Embodiments of systems and methods for backchannel encoding in virtual, augmented, or mixed reality (xR) applications in connectivity-constrained environments are described. In some embodiments, a Head-Mounted Device (HMD) may include a processor; and a memory coupled to the processor, the memory having program instructions stored thereon that, upon execution by the processor, cause the HMD to: encode each of a plurality of Simultaneous Localization and Mapping (SLAM) landmarks, in part, based upon the SLAM landmark's distance to the HMD; and transmit the encoded SLAM landmarks to an Information Handling System (IHS) coupled to the HMD.

The IHS may be configured to: decode the encoded SLAM landmarks in part, based upon the SLAM landmark's distance to the HMD; and produce a map using the decoded SLAM landmarks.

The HMD may include an Infra-Red (IR) or Near-IR (NIR) camera configured to provide IR or NIR image frames to the processor. The plurality of SLAM landmarks may be selected to have a Kalman Gain above a threshold value. The program instructions, upon execution by the processor, may cause the HMD to encode a first SLAM landmark using a first parameter in response to a first distance between the first SLAM landmark and the HMD being smaller than a threshold distance; and encode a second SLAM landmark using a second parameter in response to a second distance between the second SLAM landmark and the HMD being greater than the threshold distance.

The first parameter may provide a first level of compression, and the second parameter may provide a second level of compression higher than the first level. Alternatively, the first parameter may provide a first level of compression, and the second parameter may provide a second level of compression lower than the first level.

Prior to encoding the first and second SLAM landmarks, the program instructions, upon execution by the processor, may cause the HMD to receive a Look-Up Table (LUT) from the IHS, wherein the LUT comprises the threshold distance, the first parameter, and the second parameter. The IHS may be configured to transmit another LUT to the HMD, or modify the LUT, periodically or based upon context information.

In some cases, the context information may include a type of xR application being executed. Additionally, or alternatively, the context information may include a gaze vector. The context information may include data loss statistics. Additionally, or alternatively, the context information may include detection of a safety event at a distance smaller or greater than the threshold distance.

In another illustrative, non-limiting embodiment, a method may include receiving encoded SLAM landmarks from an HMD, where each SLAM landmark is encoded in part, based upon the SLAM landmark's distance to the HMD; decoding the encoded SLAM landmarks; and producing a map using the decoded SLAM landmarks.

The method may also include: decoding a first SLAM landmark using a first parameter in response to a first distance between the first SLAM landmark and the HMD being smaller than a threshold distance; and decoding a second SLAM landmark using a second parameter in response to a second distance between the second SLAM landmark and the HMD being greater than the threshold distance.

The method may include providing a LUT to the HMD, where the LUT comprises the threshold distance, the first parameter, and the second parameter. The method may further include selecting the LUT among a plurality of LUTs based upon at least one of: a type of xR application, a gaze vector, or detection of a safety event. The method may further include selecting the LUT among a plurality of LUTs based upon a data loss metric.

In yet another illustrative, non-limiting embodiment, a hardware memory of a Head-Mounted Device (HMD) wearable by a user may have having program instructions stored thereon that, upon execution by a processor, cause the HMD to: encode a first SLAM landmark using a first parameter in response to a first distance between the first SLAM landmark and the HMD being smaller than a threshold distance; encode a second SLAM landmark using a second parameter in response to a second distance between the second SLAM landmark and the HMD being greater than the threshold distance; and transmit the first and second encoded SLAM landmarks to an Information Handling System (IHS) coupled to the HMD. The one of the first or second parameters may provide lossless compression, and the other of the first or second parameters may provide lossy compression.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

DETAILED DESCRIPTION

Embodiments described herein provide systems and methods for backchannel encoding in virtual, augmented, or mixed reality (xR) applications in connectivity-constrained environments. These techniques are particularly useful in xR applications that employ Head-Mounted Devices (HMDs), Heads-Up Displays (HUDs), and eyeglasses—collectively referred to as "HMDs."

Figure 1:
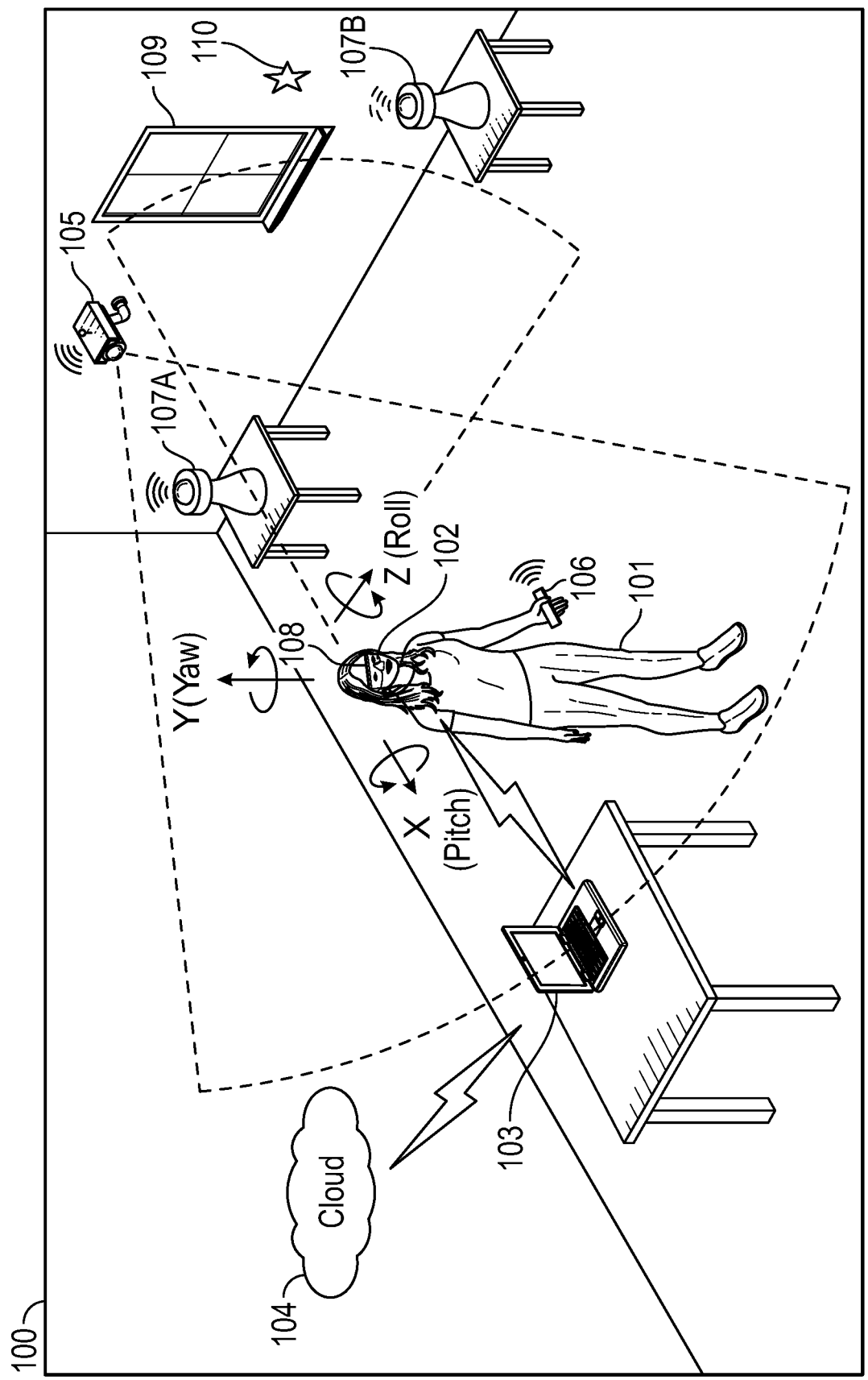
FIG. 1 illustrates an example of an environment where a virtual, augmented, or mixed reality (xR) application may be executed, according to some embodiments.

FIG. 1 is a perspective view of an example of physical environment 100 where an xR application is executed. In various embodiments, user 101 may wear HMD 102 around their heads and over their eyes, during execution of an xR application. An xR application may include a subset of components or objects executed by HMD 102 and another subset of components or objects executed by host IHS 103.

HMD 102 may be tethered to host IHS 103 via a wired or wireless connection. Particularly, host IHS 103 may be used to generate digital images to be displayed by HMD 102. HMD 102 transmits information to host IHS 103 regarding the state of user 101 (e.g., physical position, head orientation, gaze focus, etc.), which in turn enables host IHS 103 to determine which image or frame to show to the user next, and from which perspective.

For instance, as user 101 moves about environment 100, any change in: (i) physical location (e.g., x, y, and z) or translation; or (ii) orientation (e.g., pitch, yaw, and roll) or rotation, may cause host IHS 103 to effect a corresponding change in the picture or symbols displayed to user 101 via HMD 102. These changes may be detected by HMD 102 and processed by host IHS 103, for example, to maintain congruence with the outside world and/or to allow user 101 to look around a consistent xR environment.

In some implementations, host IHS 103 may execute a runtime or rendering engine, such as UNITY, UNREAL, AUTODESK, etc., which produces a visual xR model displayed by HMD 102 from a unique point-of-view, based upon the location, pose, and/or gaze of user 101-which may be determined, at least in part, using Simultaneous Localization and Mapping (SLAM).

As used herein, the term SLAM refers systems and methods that use positional tracking devices to construct a map of an unknown environment where an HMD is located, and that simultaneously identifies where the HMD is located, its orientation, and/or pose.

To enable positional tracking for SLAM purposes, HMD 102 may use wireless, inertial, acoustic, or optical sensors. And, in many embodiments, each different SLAM method may use a different positional tracking source or device. For example, wireless tracking may use a set of anchors or lighthouses 107A-B that are placed around the perimeter of environment 100 and/or one or more totems 106 or tags 110 that are tracked; such that HMD 102 triangulates its position and/or state using those elements.

Inertial tracking may use data from accelerometers and gyroscopes within HMD 102 to find a velocity and position of HMD 102 relative to some initial point. Acoustic tracking may use ultrasonic sensors to determine the position of HMD 102 by measuring time-of-arrival and/or phase coherence of transmitted and receive sound waves.

Optical tracking may include any suitable computer vision algorithm and tracking device, such as a camera of visible, infrared (IR), or near-IR (NIR) range, a stereo camera, and/or a depth camera (IR covers a portion of the electromagnetic spectrum from approximately 0.9 μm to 14 μm). With inside-out tracking using markers, for example, camera 108 may be embedded in HMD 102, and infrared markers 107A-B or tag 110 may be placed in known stationary locations. With outside-in tracking, camera 105 may be placed in a stationary location and infrared markers 106 may be placed on HMD 102 or held by user 101. In others cases, markerless inside-out tracking may use continuous searches and feature extraction techniques from video frames obtained by camera 108 (e.g., using visual odometry) to find natural visual landmarks (e.g., window 109) in environment 100.

In some cases, an IR or NIR SLAM camera may be further configured to capture thermographic images of target objects, and to provide accurate non-contact temperature measurements of those objects.

Figure 2:
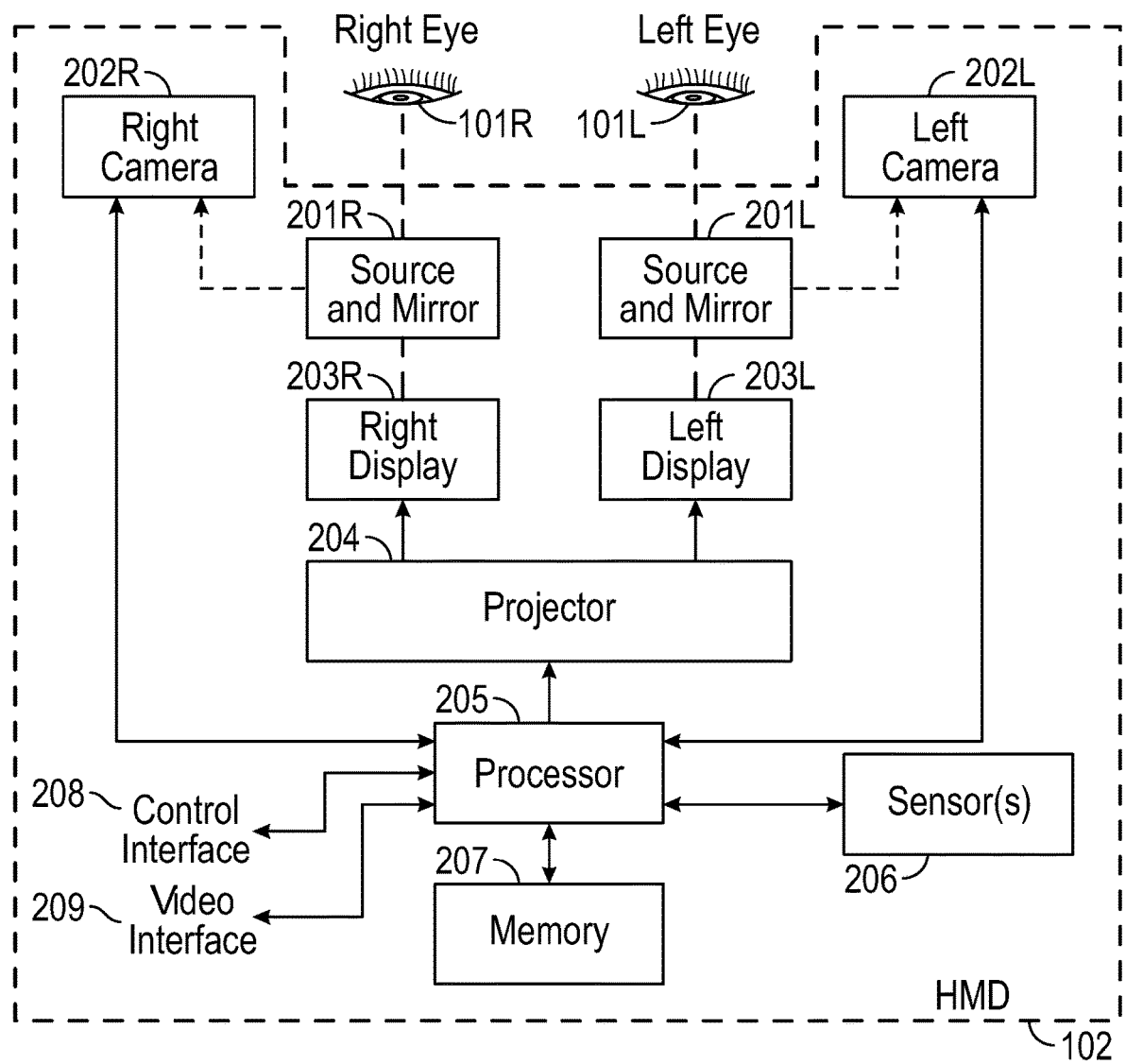
FIG. 2 illustrates an example of electronic components of a Head-Mounted Display (HMD), according to some embodiments.

FIG. 2 illustrates an example of electronic components of HMD 102. In some embodiments, HMD 102 comprises a projection system that includes projector 204 configured to display image frames, including stereoscopic right and left images, on right and left displays 203R and 203L that are viewed by a user right and left eyes 101R and 101L, respectively. Such a projection system may include, for example, a Digital Light Processing (DLP), a Liquid Crystal Display (LCD), or the like. To create a three-dimensional (3D) effect in a 3D virtual view, virtual objects (VOs) may be rendered at different depths or distances in the two images.

HMD 102 includes processor 205 configured to generate frames that are displayed by projector 204. Hardware memory 207 is configured to store program instructions executable by processor 205, as well as other data. In other embodiments, however one or more operations described for processor 205 may be implemented by a different processor within IHS 103.

Accordingly, in some embodiments, HMD 102 may also include control interface 208 and video interface 209 (e.g., a Bluetooth technology interface, USB interface, etc.) configured to communicate with IHS 103. Control interface 208 may provide forward and backward communication channels between HMD 102 and IHS 103, depending upon the architecture of the xR system, to facilitate execution of an xR application. For example, program instructions stored in memory 207, when executed by processor 205, may cause frames captured by camera(s) 108 to be transmitted to IHS 103 via control interface 208.

IHS 103 may in turn execute SLAM module 403 (FIG. 4), for example, based upon landmarks found in the video frames received from camera 108. Particularly, SLAM module 403 may be configured to implement tracking techniques that use distinctive visual characteristics of the physical environment to identify specific images or shapes which are then usable to calculate HMD 102's position and orientation. Then, rendering engine 406 (FIG. 4) may use data from SLAM module 403 to render an image to be provided to projector 204 via video interface 209 (e.g., High-Definition Multimedia Interface or "HDMI," Digital Visual Interface or "DVI," DISPLAYPORT, etc.). In some cases, video interface 209 may include two separate video interfaces, one for each display 203R/L. Additionally, or alternatively, a single interface that supports multi-stream may be used to drive both displays 203R/L.

In some embodiments, HMD 102 may include one or more sensors 206 that collect information about the user's environment (e.g., video, depth, lighting, motion, etc.) and provide that information to processor 205. Sensors 206 may include, but are not limited to, inside-out cameras, outside-in cameras, eye tracking cameras, RGB cameras, gesture cameras, infrared (IR) or near-IR (NIR) cameras, SLAM cameras, etc. Additionally, or alternatively, sensors 206 may include electric, magnetic, radio, optical, infrared, thermal, force, pressure, acoustic, ultrasonic, proximity, position, deformation, movement, velocity, rotation, gyroscopic, and/or acceleration sensor(s). In some cases, sensors 206 may be coupled to processor 205 via a sensor hub.

HMD 102 may be configured to render and display frames to provide an xR view for user 101 according to inputs from sensors 206. For example, an xR view may include renderings of the user's real-world environment based on video captured by camera 108. The xR view may also include virtual objects composited with the projected view of the user's real environment.

Still referring to FIG. 2, right and left Near Infra-Red (NIR) light sources 201R and 201L (e.g., NIR LEDs) may be positioned in HMD 102 to illuminate the user's eyes 101R and 101L, respectively. Mirrors 201R and 201L (e.g., "hot mirrors") may be positioned to direct NIR light reflected from eyes 101R and 101L into EGT cameras 202R and 202L located on each side of the user's face. In other implementations, instead of EGT cameras 202R and 202L, a single EGT camera, or a combination of a wide-angle camera with and a narrower-angle camera, may be used.

EGT information captured by cameras 202R and 202L may be provided to processor 205 to be further processed and/or analyzed. For example, processor 205 may adjust the rendering of images to be projected, and/or it may adjust the projection of the images by the projector 204 based on the direction and angle at which eyes 101R/L are looking. Additionally, or alternatively, processor 205 may estimate the point of gaze on right and left displays 203R and 203L to enable gaze-based interaction with xR content shown on those displays.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below.

Figure 3:
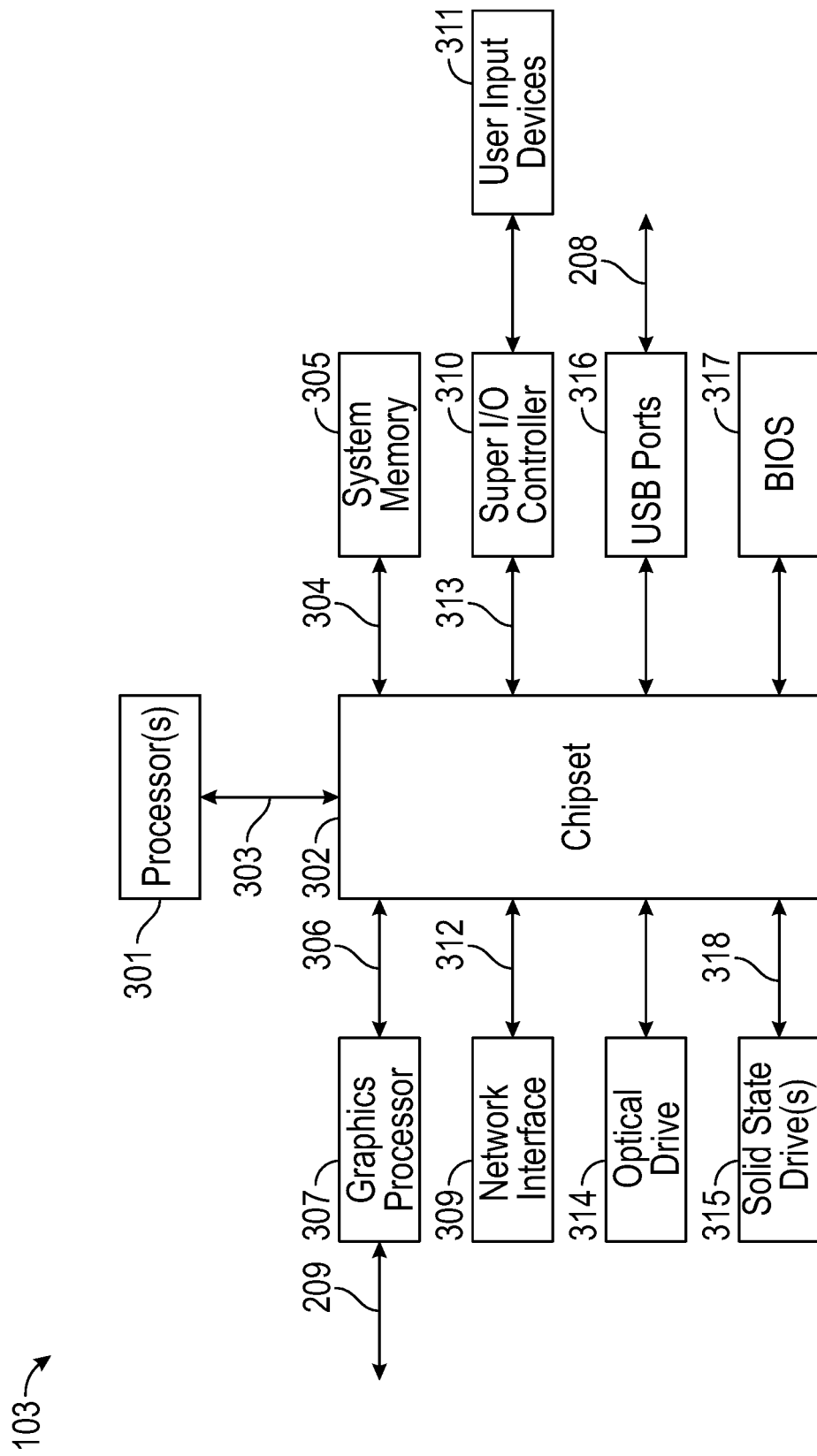
FIG. 3 illustrates an example of electronic components of an Information Handling System (IHS), according to some embodiments.

FIG. 3 is a block diagram of host IHS 103, according to certain embodiments. As shown, IHS 103 may include one or more processors 301. In various implementations, IHS 103 may be a single-processor system including one processor 301, or a multi-processor system including two or more processors 301. Processor(s) 301 may include any processor capable of executing program instructions, such as an Intel Pentium™ series processor or any general-purpose or embedded processors having any of a variety of Instruction Set Architectures (ISAs), such as the x86, POWERPC®, ARM®, SPARC®, or MIPS® ISAs, or any other suitable ISA.

IHS 103 includes chipset 302 that may include one or more integrated circuits that are connect to processor(s) 301. In certain embodiments, chipset 302 may utilize QuickPath Interconnect (QPI) bus 303 for communicating with the processor(s) 301. Chipset 302 provides the processor(s) 301 with access to a variety of resources. For instance, chipset 302 provides access to system memory 305 over memory bus 304. System memory 305 may be configured to store program instructions and/or data accessible by processors(s) 301. In various embodiments, system memory 305 may be implemented using any suitable memory technology, such as static RAM (SRAM), dynamic RAM (DRAM) or nonvolatile/Flash-type memory.

Chipset 302 may also provide access to graphics processor 307. In certain embodiments, graphics processor 307 may be comprised within one or more video or graphics cards that have been installed as components of IHS 103. Graphics processor 307 may be coupled to chipset 302 via graphics bus 306 such as provided by an Accelerated Graphics Port (AGP) bus or a Peripheral Component Interconnect Express (PCIe) bus. In certain embodiments, graphics processor 307 generates display signals and provides them to HMD device 102 via video interface 209.

In certain embodiments, chipset 302 may also provide access to one or more user input devices 311. In such embodiments, chipset 302 may be coupled to a super I/O controller 310 that provides interfaces for a variety of user input devices 311, in particular lower bandwidth and low data rate devices. For instance, super I/O controller 310 may provide access to a keyboard and mouse or other peripheral input devices. In certain embodiments, super I/O controller 310 may be used to interface with coupled user input devices 311 such as keypads, biometric scanning devices, and voice or optical recognition devices, through wired or wireless connections. In certain embodiments, chipset 302 may be coupled to the super I/O controller 310 via a Low Pin-Count (LPC) bus 313.

Other resources may also be coupled to the processor(s) 301 of IHS 103 through chipset 302. In certain embodiments, chipset 302 may be coupled to a network interface 309, such as provided by a Network Interface Controller (NIC) that is coupled to IHS 103. In certain embodiments, the network interface 309 may be coupled to chipset 302 via a PCIe bus 312. According to various embodiments, network interface 309 may support communication via various wired and/or wireless networks. In certain embodiments, chipset 302 may also provide access to one or more Universal Serial Bus (USB) ports 316; which in some implementations may serve as transport for establishing control interface 208 with HMD 102.

Chipset 302 also provides access to one or more solid-state storage devices 315. Chipset 302 utilizes a PCIe bus interface connection 318 in order to communication with the solid-state storage device 315. In certain embodiments, chipset 302 may also provide access to other types of storage devices. For instance, in addition to the solid-state storage device 315, an IHS 103 may also utilize one or more magnetic disk storage devices, or other types of the storage devices such as an optical drive or a removable-media drive. In various embodiments, the solid-state storage device 315 may be integral to IHS 103, or may be located remotely from IHS 103.

Another resource that may be accessed by processor(s) 301 via chipset 302 is a Basic Input/Output System (BIOS) 317. As described in more detail below with respect to additional embodiments, upon powering or restarting IHS 103, processor(s) 301 may utilize BIOS 317 instructions to initialize and test hardware components coupled to IHS 103 and to load an operating system for use by IHS 103. BIOS 317 provides an abstraction layer that allows the operating system to interface with certain hardware components that are utilized by IHS 103. Via this hardware abstraction layer provided by BIOS 317, the software executed by the processor(s) 301 of IHS 103 is able to interface with certain I/O devices that are coupled to IHS 103. As used herein, the term "BIOS" is intended to also encompass Unified Extensible Firmware Interface (UEFI).

In various embodiments, HMD 102 and/or host IHS 103 may not include each of the components shown in FIGS. 2 and 3, respectively. Additionally, or alternatively, HMD 102 and/or host IHS 103 may include various components in addition to those that are shown in FIGS. 2 and 3. Furthermore, some components that are represented as separate components in FIGS. 2 and 3 may, in some embodiments, be integrated with other components. For example, in various implementations, all or a portion of the functionality provided by the illustrated components may instead be provided by components integrated into the one or more processor(s) as a system-on-a-chip (SOC) or the like.

Figure 4:
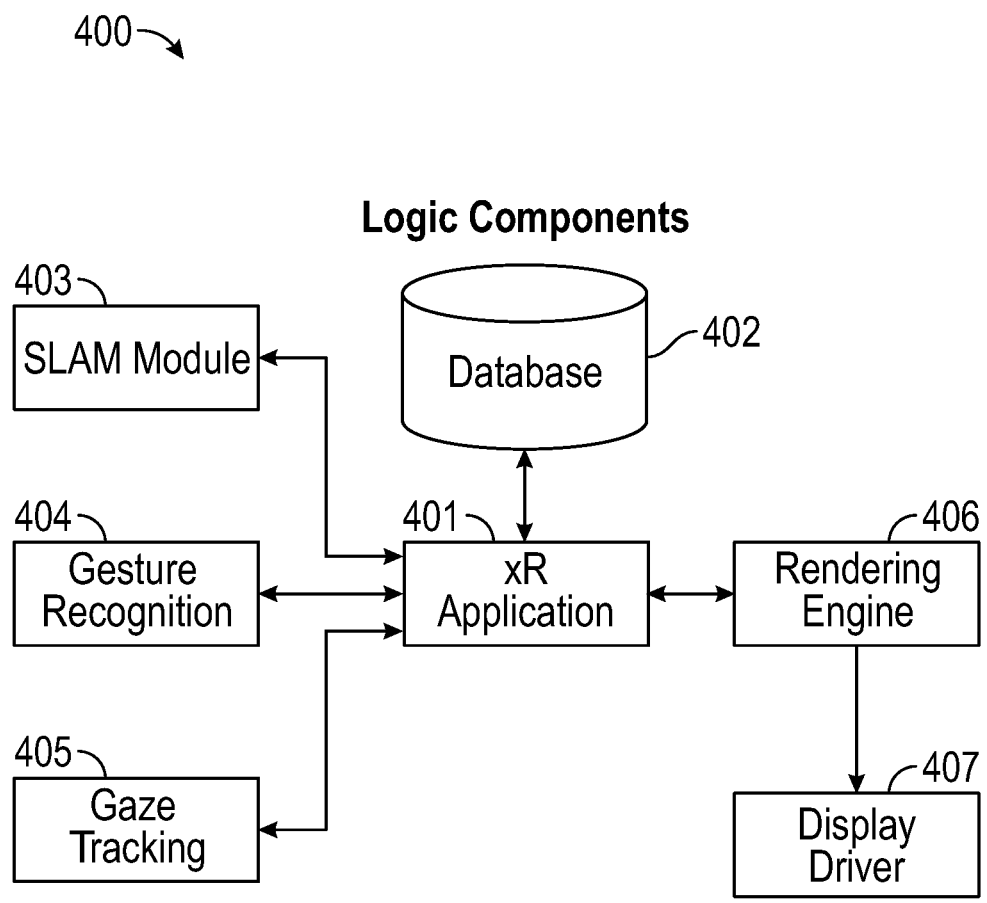
FIG. 4 illustrates an example of logic components of an xR application, according to some embodiments.

FIG. 4 illustrates logic components 400 of xR application 401. In various embodiments, logic components 400 may be executed by IHS 103 and/or HMD 102, such that sub-parts of each of logic components 400 may run on processor 205 of HMD 102 and/or 301 of IHS 103. Moreover, program instructions implementing logic components 400 may be stored in memory 207 of HMD 102 and/or memory 305 of IHS 103.

Generally speaking, xR application 401 may include any type of application now existing or yet to be developed, including, but not limited to: entertainment, video games, robotics, healthcare, education and training, military uses, occupational safety, engineering, industrial or product design, collaboration applications, virtual meetings, etc. Moreover, any data required or otherwise used during operation of xR application 401 may be stored in database 402, discussed in more detail below.

SLAM module 403 uses positional tracking devices to construct a map of an unknown environment where HMD 102 is located, which simultaneously identifies where the HMD is located, its orientation, and/or pose. Generally, SLAM module 403 may include a propagation component, a feature extraction component, a mapping component, and an update component. The propagation component may receive angular velocity and accelerometer data from an Inertial Measurement Unit (IMU) built into HMD 102, for example, and it may use that data to produce a new HMD position and/or pose estimation. A camera (e.g., a depth-sensing camera) may provide video frames to the feature extraction component, which extracts useful image features (e.g., using thresholding, blob extraction, template matching, etc.), and generates a descriptor for each feature. These features, also referred to as "landmarks," are then fed to the mapping component.

The mapping component may be configured to create and extend a map, as HMD 102 moves in space. Landmarks may also be sent to the update component, which updates the map with the newly detected feature points and corrects errors introduced by the propagation component. Moreover, the update component may compare the features to the existing map such that, if the detected features already exist in the map, the HMD's current position may be determined from known map points.

An estimator, such as an Extended Kalman filter (EKF), may be used for handling the propagation component of an inside-out SLAM method. A map may be generated as a vector stacking sensors and landmarks states, modeled by a Gaussian variable. The map may be maintained using predictions (e.g., when HMD 102 moves) and/or corrections (e.g., camera 108 observes landmarks in the environment that have been previously mapped). In other cases, a map of environment 100A may be obtained, at least in part, from cloud 104.

For example, HMD 102 may capture IR/NIR frames (e.g., from camera 108), perform image pre-processing operations, generate object detection of landmarks using feature extraction techniques, and send SLAM data (e.g., pixel values for each pixel, along with IR/NIR frame data, coordinates of detected landmarks, etc.) to host IHS 103. Host IHS 103 may perform EKF operations for each detected landmark and it may calculate a Kalman Gain (G) for each landmark (L), which in turn indicates a confidence or probability of the landmark's measured location being accurate.

Gesture recognition module 404 may use one or more cameras or optical sensors that enable user 101 to use their actual hands for interaction with virtual objects (VOs) rendered by projector 204 within HMD 102. For example, gesture recognition module 404 may be configured to implement hand tracking and gesture recognition in a 3-D space via a user-facing 2-D camera. In some cases, gesture recognition module 404 may track a selectable number of degrees-of-freedom (DOF) of motion, with depth information, to recognize dynamic hand gestures (e.g., swipes, clicking, tapping, grab and release, etc.) usable to control or otherwise interact with xR application 401.

Gesture detection begins when video frame data (e.g., a video or depth-video stream) is received at host IHS 103 from gesture or RGB camera 108 of HMD 102. In some implementations, video data may have already been processed, to some degree, by processor 205 of HMD 102. Then, the video data is further processed by processors 302 and/or 307 in IHS 103 to control aspects of xR application 401, by identifying various gestures and sequences that constitute user input. At least a portion of the user's body may be identified in the video frame data obtained using gesture or RGB camera 108. For example, through image processing, a given locus of a video frame or depth map may be recognized as belonging to user 101. Pixels that belong to user 101 (e.g., arms, hands, fingers, etc.) may be identified, for example, by sectioning off a portion of the video frame or depth map that exhibits above-threshold motion over a suitable time scale, and attempting to fit that section to a geometric model of user 101. If a suitable fit is achieved, then pixels in that section may be recognized as those of user 101.

Gesture recognition module 404 may be configured to analyze pixels of a video frame or depth map that correspond to user 101, in order to determine what part of the user's body each pixel represents. A number of different body-part assignment techniques may be used. In an example, each pixel of the video frame or depth map may be assigned a body-part index. The body-part index may include a discrete identifier, confidence value, and/or body-part probability distribution indicating the body part or parts to which that pixel is likely to correspond. Machine learning may be used to assign each pixel a body-part index and/or body-part probability distribution. Such a machine learning method may analyze a user with reference to information learned from a previously trained collection of known gestures and/or poses stored in a calibration database. During a supervised training phase, for example, a variety of gesture sequences may be observed, and trainers may provide label various classifiers in the observed data. The observed data and annotations may then be used to generate one or more machine-learned algorithms that map inputs (e.g., observation data from a depth camera) to desired outputs (e.g., body-part indices for relevant pixels).

Thereafter, a partial virtual skeleton may be fit to at least one body part identified. In some embodiments, a partial virtual skeleton may be fit to the pixels of video frame or depth data that correspond to a human arm, hand, and/or finger(s). A body-part designation may be assigned to each skeletal segment and/or each joint. Such virtual skeleton may include any type and number of skeletal segments and joints, including each individual finger). By analyzing positional change in the various skeletal joints and/or segments, certain corresponding movements that indicate predetermined gestures, actions, or behavior patterns of user 101 may be identified. In other embodiments, the use of a virtual skeleton may not be necessary. For example, in other implementations, raw point-cloud data may be sent directly to a feature extraction routine within a gesture recognition module.

Examples of one and two-handed gestures that may be recognized or tracked by gesture recognition module 404 include, but are not limited to: gestures for selecting and deselecting VOs, gestures for manipulating selected VOs (e.g., rotation and/or translation following the user's hand direction, position, and/or location), gestures for performing menu operations such as opening, closing, and/or repositioning (again, with menu rotation and/or translation following the user's hand), and gestures for manipulating applications, windows, or workspaces (e.g., using downward or upward swiping hand motion), among many others.

Gaze tracking module 405 may use an inward-facing projector, configured to create a pattern of infrared or (near-infrared) light on the user's eyes, and an inward-facing camera configured to take high-frame-rate images of the eyes and their reflection patterns; which are then used to calculate the user's eye's position and gaze focus or point. In some cases, gaze tracking module 405 may be configured to identify a direction, extent, and/or speed of movement of the user's eyes in real-time, during execution of an xR application (e.g., a gaze vector). In addition, gaze tracking module 405 may be configured to calculate a region-of-interest of configurable size or shape (e.g., circular, rectangular, etc.), based in part upon the gaze vector.

As used herein, the term "gaze vector" is defined as a group of variables calculated using reflections from pupil center and another set of glints generated in the user's eye. In some cases, a gaze vector may include one or more of the following variables: 3D coordinates (x, y, z) of an initial point (e.g., the midpoint between the user's eyes), and pitch and yaw direction angles.

In various implementations, gaze tracking module 405 may use, among camera(s) and/or sensor(s), NIR light sources to produce glints on the surface of the cornea of the user's eye, and then it may capture images of the eye region using an inward-facing camera. Gaze tracking module 405 may estimate the user's gaze from the relative movement between the pupil center and glint positions. Particularly, an eye and/or gaze tracking algorithm may perform corneal reflection-based calculations that use NIR illumination to estimate the gaze direction or the point of gaze using polynomial functions, or a geometrical model of the human eye.

To perform gaze estimation, gaze tracking module 405 may estimate the visual axis and kappa angle of the user's eye, for each user, as part of a calibration operation. Calibration may be performed by showing the user a set of visual targets distributed over the HMD's display, and the user may be asked to gaze at them for a certain amount of time. The inward-facing camera may capture the various eye positions for each target point, which are then mapped to corresponding gaze coordinates.

In some cases, gaze tracking module 405 may be configured to compensate for head movement. For example, a mathematical formula indicating the correspondence of eye gaze with head positions may represent a relationship between user reference gaze directions, head pose direction, and actual gaze direction; which is a result of both head and eye rotation.

In various embodiments, gaze tracking module 405 may perform any of a plurality of different EGT methods. For example, in two-dimensional (2D) regression-based EGT methods, a vector between the pupil center and a corneal glint may be mapped to corresponding gaze coordinates on the frontal screen using a polynomial transformation function. Conversely, three-dimensional (3D)—based EGT methods may use a geometrical model of the human eye to estimate the center of the cornea, optical and visual axes of the eye, and to estimate the gaze coordinates as points of intersection where the visual axes meets the scene.

As such, in various embodiments, gaze tracking module 405 may produce, collect, measure, and/or produce information about a user's intent, cognitive processes, and behavior, based upon the user's eye movements, that may include, but is not limited to: (A) Fixations: phases when the eyes are stationary between movements and visual input occurs (e.g., total fixation duration, mean fixation duration, fixation spatial density, number of areas fixated, fixation sequences and fixation rate); (B) Saccades: rapid and involuntary eye movements that occur between fixations (e.g., saccade number, amplitude and fixation-saccade ratio); (C) Scanpath: a series of short fixations and saccades alternating before the eyes reach a target location on the screen (e.g., scanpath direction, duration, length and area covered); (D) Gaze duration: a sum of all fixations made in an area of interest before the eyes leave that area and also the proportion of time spent in each area; and/or (E) Pupil size and blink: measures used to study cognitive workload.

Based upon the foregoing, gaze tracking module 405 may be configured to follow the user's gaze direction for natural exploration of a visual scene by capturing the user's visual perspective. Moreover, gaze tracking module 405 may also be configured to estimate user gaze and blink-state for interacting with the xR environment; several types of eye movements and gestures, such as saccades, smooth pursuit and nod-roll may be used. For example, gaze tracking module 405 may be configured to use gaze, dwell time, and half-blink information for the purpose of hands-free object selection. Multiple input parameters may be used to avoid accidental selection of items. Pupil motion may be tracked to estimate a user's viewing point, with Kalman filtering to minimize pupil jitter and drifts.

Rendering engine 406 may include any engine (e.g., UNITY, UNREAL, AUTODESK, etc.) configured to render an xR model or virtual space displayed by HMD 102 from user 101's unique point-of-view based upon the user's coordinate location (e.g., from SLAM module 403), the user's pose (e.g., from an IMU), and/or the user's gaze (e.g., from gaze tracking module 405). Display driver 407 is coupled to rendering engine 406 and configured to convert rendered video frames to a display format that HMD 102 can reproduce before the user's eyes.

Figure 5:
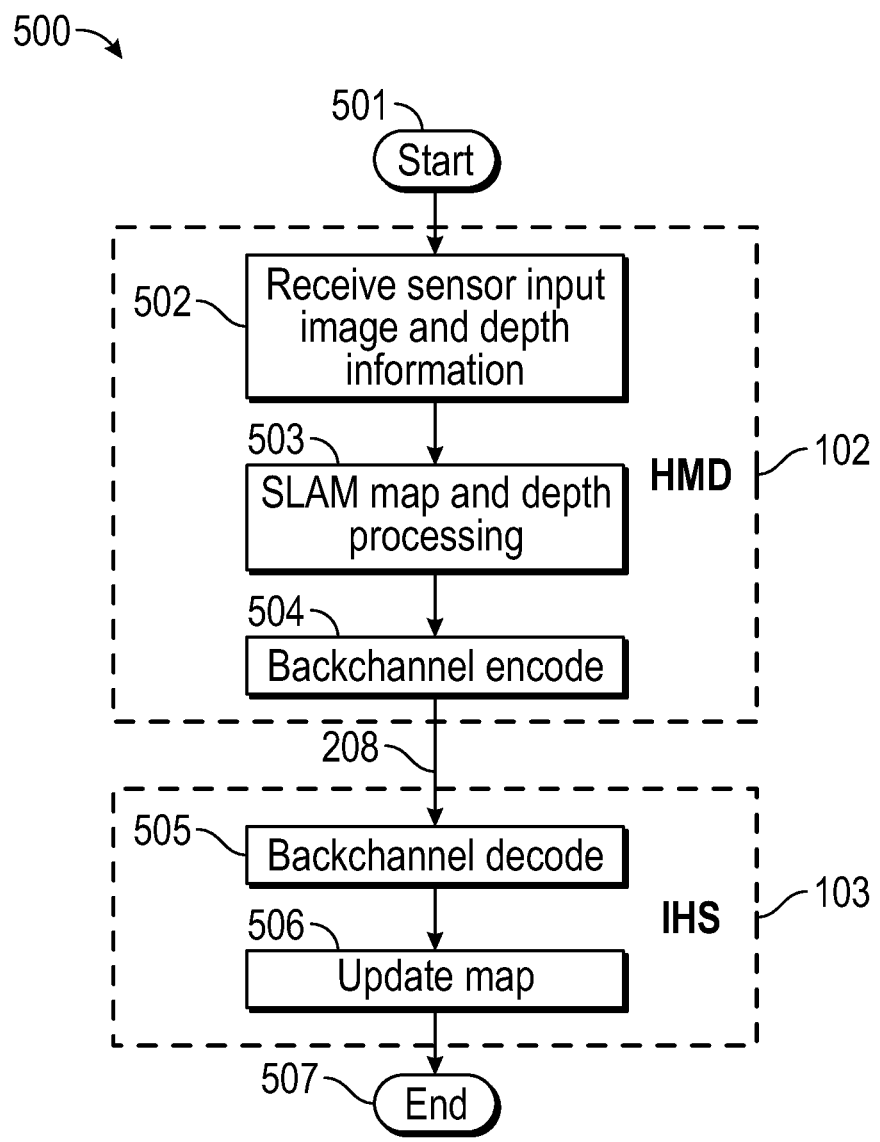
FIG. 5 illustrates an example of a method for backchannel encoding, according to some embodiments.
Figure 6:
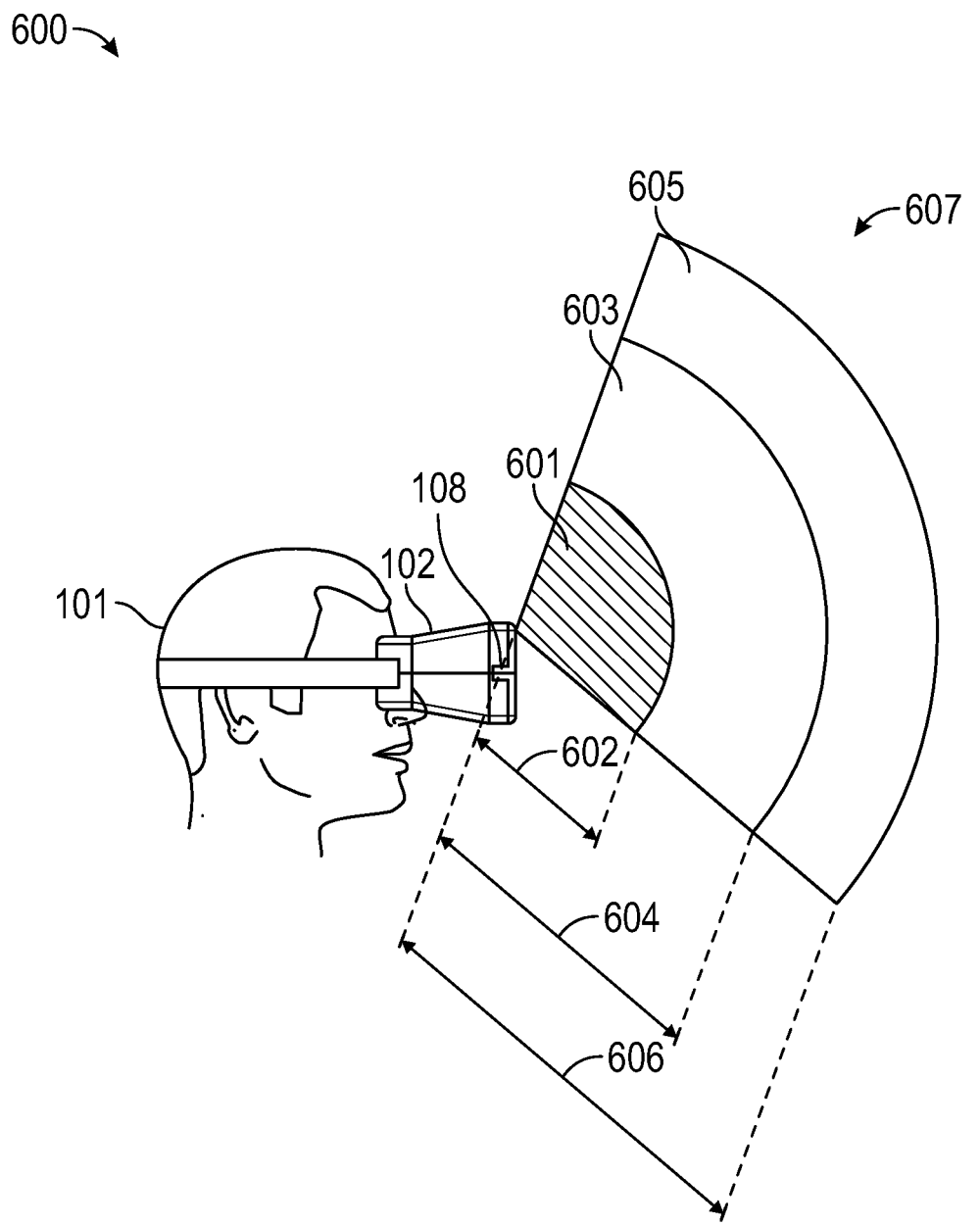
FIG. 6 illustrates an example of Simultaneous Localization and Mapping (SLAM) landmark zones configurable by distance from the HMD, according to some embodiments.
Figure 7:
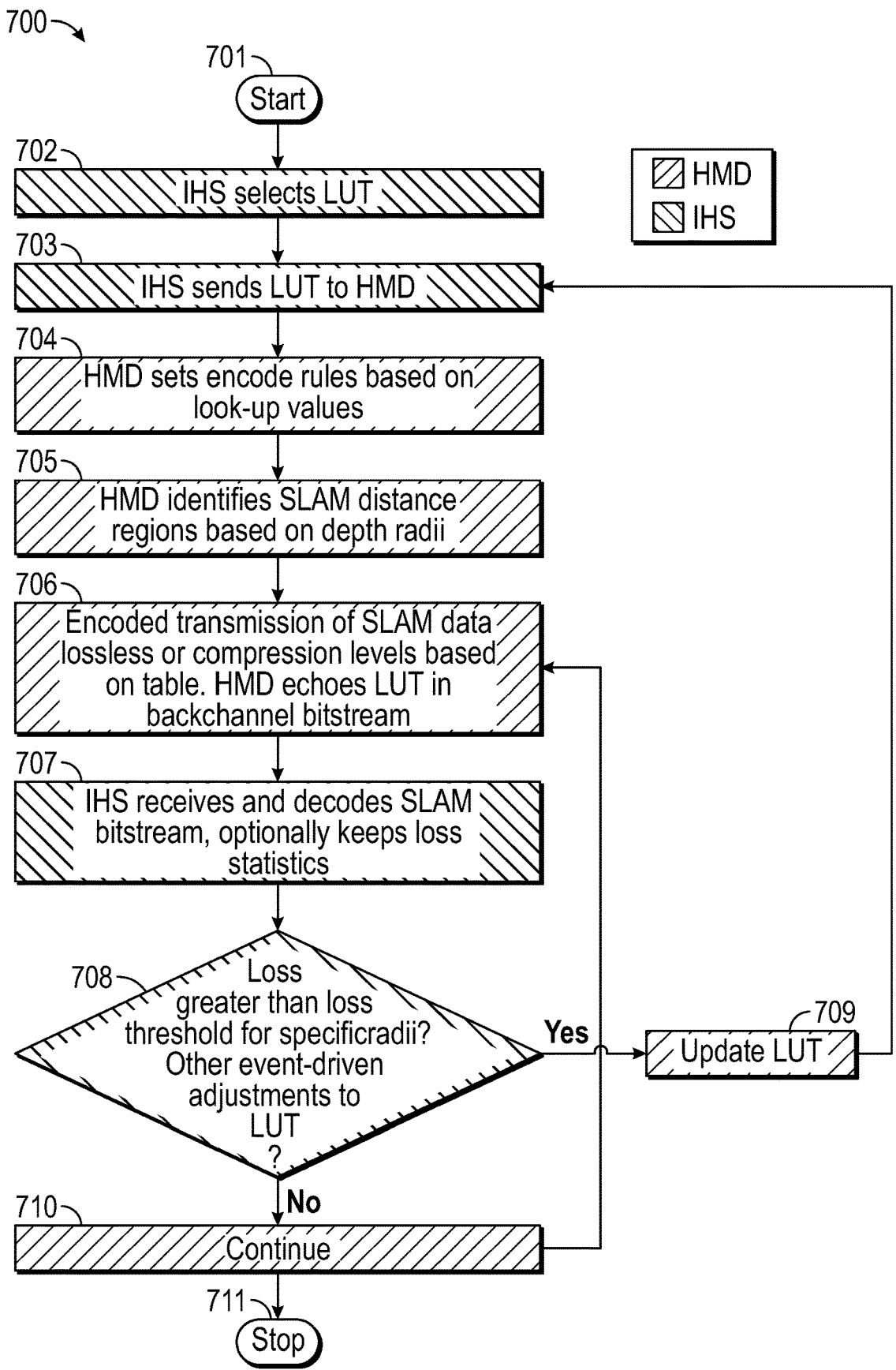
FIG. 7 illustrates an example of a method for encoding SLAM data transmitted by an HMD to an IHS, according to some embodiments.

Database 402 may include if/then rules and/or Look-Up Tables (LUTs) to implement the various methods described in FIGS. 5-7. In some cases, an if/then rule catalog may be filtered based upon the presence or identification of a master object and/or other surrounding, secondary objects in the user's Field-of-View (FOV). Database 402 may include different if/then rule catalogs based upon the identity of an authenticated user, for example, as part of a profile. Additionally, or alternatively, if/then rules may be based upon historic continuous usage.

As used herein, the terms "transformation matrix" or "transform matrix" refer to matrices that determine how objects move around in space. For example, in some cases a transform matrix may be a 4×4 matrix that defines a transformation when applied to objects: translation, rotation and scaling. Translating an object moves it in space, rotating turns an object around its center, and scaling changes the size of an object. To apply a transform to a 3D object, such as a VO, every vertex in the 3D object may be multiplied by the transformation matrix.

When rendering engine 406 is operating, it needs to know where to place the "view camera" (i.e., the point of view for the render) in a given scene, which is done using a view matrix. For example, in some cases a view matrix may be a 4×4 matrix that contains information about the position and orientation of a viewing camera. Every vertex in the scene or frame may be multiplied the view matrix and the scene is rendered by HMD 102 (although the view matrix says how everything else in the scene should change to reflect the point of view of the camera, the camera itself does not move).

The inverse of the view matrix is referred to as the camera transform matrix, which describes how camera 108 itself moves around a scene or frame. That is, the camera transform matrix provides the position and rotation of camera 108.

To illustrate the distinction between a transform matrix and a view matrix, consider a scene that starts with camera 108 looking directly at a chair that is positioned in front of it. The user then turns the camera 45 degrees to the right (a). In this case the camera transform matrix would be a rotation matrix that indicates a 45-degree rotation to the right. The view matrix, however, would be a rotation matrix that indicates 45-degree rotation to the left around the camera's position. In another scene, if the user turns to the left and walks forward, the camera transform matrix would be a rotation matrix to the left followed by a translation matrix forward, which indicates how the user moved in the frame.

For example, if the user looks to the right (and HMD 102 turns right), the camera transform matrix obtained from SLAM sensor data may include a rotation to the right. If the user looks to the left (and HMD 102 turns left), the camera transform matrix obtained from SLAM sensor data may include a rotation to the left. If the user looks up (and HMD 102 turns upward), the camera transform matrix obtained from SLAM sensor data may include a rotation upward. And if the user looks down (and HMD 102 turns downward), the camera transform matrix obtained from SLAM sensor data may include a rotation downward. More generally, rotations around any axis may be performed by taking a rotation around the x axis, followed by a rotation around the y axis, and followed by a rotation around the z axis—such that any spatial rotation can be decomposed into a combination of principal rotations. Moreover, if HMD 102 moves forward, backward, or sideways, the camera transform matrix obtained from SLAM sensor data also reflects the resulting translation.

The term "world space," for xR application 401, refers to a coordinate system that defines where everything is located inside the application. Every object handled by xR application 401 may be given an X, Y and Z coordinate relative to an origin. Once calibrated, HMD sensors can transform their sensor data into world space coordinates. Then, when transform matrices are applied to 3D objects, the objects are moved around in world space. For instance, world space coordinates may be used by xR application 401 to overlay virtual hands directly on-top of the user's real hands.

Most xR HMDs 102 are tethered, wired or wirelessly, to host IHS 103 (or a mobile platform) for compute purposes. In recent years, wirelessly tethered xR has started to gain increasing adoption, as well as investment in technology— yet wired connections between HMD 102 and IHS 103 are still widely in use today. As the performance requirements of xR increase, connectivity becomes a key constraint to the overall performance of an xR solution. Connectivity constraints are particularly apparent in (but are not limited to) cases where HMD 102 is wirelessly tethered to IHS 103.

Architectures for tethered xR generally take the form of a server-client streaming architecture, with different transport layer mechanisms, such as Real-time Transport Protocol (RTP) over User Datagram Protocol (UDP)/Transmission Control Protocol (TCP), or the like. In various embodiments, IHS 103 is the server, which uses its own GPU (e.g., GPU 307 in FIG. 3) to render xR content using render engine 406, for example, to produce audio and 3D graphics with left (L) and right (R) views for display by the client, that is, HMD 102. As part of its rendering process, engine 406 may receive input from SLAM driver (e.g., SLAM module 403), which takes preprocessed SLAM IR camera frames from HMD 102 in order to render an updated world space camera view.

During execution of xR application 401, HMD 102 and IHS 103 exchange SLAM sensor data, EGT sensor data, EGT data, inter-process (IPC) communication data via control interface 208, also referred to herein as a "backchannel." Meanwhile, IHS 103 transmits encoded packetized rendered content (e.g., audio-video) to HMD 102 via video interface 209.

In addition to preprocessed SLAM data, backchannel 208 may also include transmission of additional content, such as contextual sensor data, video or audio capture, and user commands back to IHS 103. Of these potential sources of content, SLAM data is typically the most time critical given the need for IHS 103 to process new location and pose information within the latency constraints for closed-loop transmission of rendered content to HMD 102.

As both the requirements and the ability for better mapping increase, backchannel constraints become more apparent. Increases in SLAM content can result in the addition of more cameras, including: 360 mapping FOV, depth sensing, etc. Due to constrained connectivity and/or degraded connectivity, transmitted data may be lost or delayed (out-of-order) resulting, in the case of SLAM, in mapping and tracking errors.

Accordingly, embodiments described herein may include systems and methods for handling encoding and/or compression levels of SLAM data transmitted over backchannel 208 based on depth map information in the SLAM map itself. These rules may establish distance radii from HMD 102 to landmarks within the SLAM map. SLAM landmarks occurring at a given distance are collectively transmitted to the IHS 103 with encoding techniques and/or compression levels (e.g., higher or lower bit-rates) associated with given distance or depth of radius, and as indicated in an LUT previously selected by IHS 103.

In some cases, HMD 102 may execute these methods without having to receive or interpret data loss statistics. Instead, IHS 103 may monitor data loss and set rules for distance(s) accordingly. For example, policies at IHS 103 may be set and stored in database 402 based on loss statistics or use case attributes (e.g., mode of operation, type of xR application 401 being executed, detection of a safety event, identification of a selected virtual object or VO, etc.). Sensitivity to data loss may be related in general to mission criticality or to published service levels. For instance, a case-specific policy may include reducing compression loss in depth areas or zones critical to the user's safety. As such, the same HMD 102 may be used with different safety policies for a lab environment versus a factory floor.

In some cases, a system and method may provide a service in HMD 102 that establishes encode rules (e.g. adaptive bit encoding) based on depth information depth map from a preprocessor (e.g., a video or graphical processing unit) or preprocessing module to determine compression for details within certain radius.

Particularly, a method may be performed as follows: (i) IHS 103 sets a default LUT; (ii) IHS 103 passes LUT values to HMD 102 through IPC backchannel 208; (iii) HMD 102 sets encode/compression rules based on lookup values for encode selection based on distance/depth; (iv) HMD 102 receives SLAM sensor input that includes depth map information across the map; (v) HMD 102's preprocessing identifies SLAM regions based on depths radii using on LUT; (vi) HMD 102 encodes SLAM data for transmission to IHS 103 with varying compression based on LUT (echoes LUT in backchannel bitstream); (vii) IHS 103 receives SLAM data and keeps statistics on data loss; (viii) IHS 103 keeps statistics for data loss; (ix) IHS identifies data loss and adjusts the LUT, if needed (may also change radii based on changes in use case, such as safety or different environment); and (x) IHS 103 retransmits the new, adjusted LUT through IPC backchannel 208.

FIG. 5 illustrates an example of method 500 for backchannel encoding. In various embodiments, blocks 502-504 of method 500 may be performed by HMD 102, and blocks 505 and 506 may be performed by IHS 103. Particularly, method 500 begins at block 501.

At block 502, HMD 102 receives sensor input image and depth information from one or more SLAM sensors, such as an NIR camera, a depth camera, etc. At block 503, HMD 102 may perform SLAM map and depth processing upon the data received in block 502, to thereby produce, frame-by-frame, SLAM data to be transmitted to IHS 103. For example, the SLAM data may include a plurality of SLAM landmarks, landmark coordinates, and Kalman Gain values; and/or a SLAM map. Then, at block 504, HMD 102 may perform an encoding operation upon the SLAM data, following rules and parameters stored in a LUT (previously received from IHS 103), and it may send the encoded SLAM data to IHS 103 via backchannel 208.

At block 505, IHS 103 may receive and decode the encoded SLAM data using the same encoding and/or compression rules and parameters being enforced by HMD 102 (e.g., using a selected one of plurality of LUTs). At block 506, IHS 103 updates the map used by xR application 401 using the decode SLAM data. Method 500 ends at block 507.

FIG. 6 illustrates an example of SLAM landmark zones or constellations 600, configurable by distance from (camera 108 mounted on) HMD 102. In various embodiments, any suitable number of zones may be employed. Although zones 600 are shown in two-dimensions, it should be noted that each of zones 600 may be a section of a three-dimensional (3D) conical shape, with spherical boundaries of radii 602, 604, and 606, respectively.

In this particular case, four zones 600 are configured: near-field zone 601 for SLAM landmarks having depth radii smaller than distance 602; mid-field 603 for SLAM landmarks having depth radii between distances 602 and 604; far-field 605 for SLAM landmarks with depth radii between distances 604 and 606; and excluded zone 607 for SLAM landmarks with depth radii greater than distance 606 (e.g., in meters).

In some implementations, SLAM landmarks may be selected within 3D Regions-of-Interest (ROIs) within otherwise 3D spherical slices or zones 600. And each ROI may have a distinct encoding or compression requirement (e.g., higher fidelity, lower compression), within the same slice or zone.

An example of an LUT that establishes encoding/compression parameters for SLAM landmarks located within each of zones 600 is shown in Table I below.

TABLE I

Example Look-Up Table (LUT)

| Zone (FIG. 6) | Normalized Radius | Depth of Radius | Encoding/Compression Parameter |
|---|---|---|---|
| 601 | 0.0-0.1 | 0-1 m | Lossless |
| 603 | 0.1-0.5 | 1-2 m | 10% Compression |
| 605 | 0.5-0.8 | 2-5 m | 50% Compression |
| 607 | >0.8 | >5 m | Discard |

In the example of Table I, it is assumed that SLAM landmarks closest to HMD 102 in zone 601 are of higher importance, and therefore subject to lossless compression, whereas SLAM landmarks farthest from HMD 102 in zone 607 are discarded. As a result of application of this LUT, the "foreground" of the user's FOV may be more accurately mapped using the losslessly compressed (or uncompressed) SLAM landmarks of zone 601 than the "background" of the user's FOV. In other cases, however, a reverse LUT may be applied that favors preservation of information regarding SLAM landmarks farthest away from HMD 102, such that the background of the user's FOV may be more accurately mapped than the foreground.

In some cases, IHS 103 may maintain different LUTs, and it may select one among the plurality of LUTs based upon a data loss metric (e.g., using bit error rate thresholds, etc.). Additionally, or alternatively, IHS 103 may select one among the plurality of LUTs based upon other context information, such as a type of xR application being executed, a gaze vector, interaction with a particular VO, detection of a safety event or hazardous condition in one or more of zones 600 (e.g., via object detection), etc.

FIG. 7 illustrates method 700 for encoding SLAM data transmitted by HMD 102 to IHS 103. In various embodiments, blocks 702, 703, 707, and 708 of method 700 may be performed by IHS 103, and blocks 701, 704-706, 709, and 710 may be performed by HMD 102.

Particularly, method 700 begins at block 701. At block 702, IHS 103 selects one of a plurality of available LUTs, for example, based upon context, data loss metrics, etc. At block 703, IHS 103 sends the selected LUT to HMD 102 through IPC over backchannel 208.

At block 704, HMD 102 sets encode/compression parameters of SLAM landmark data based upon LUT values. At block 705, HMD 102 identifies SLAM distance regions (e.g., zones 600 in FIG. 6) based on depth radii. At block 706, HMD 102 encodes transmission of SLAM data with lossless or compression levels based on the LUT. Still at block 706, HMD 102 echoes the LUT in the backchannel bitstream 208.

At block 707, IHS 103 receives and decodes the SLAM bitstream, and maintains data loss metrics or statistics. At block 708, IHS 103 determines whether the data loss metric or statistic is greater than a loss threshold for any particular radii or zone, or whether any context or event driven adjustments are to be made to the LUT (or whether another LUT should be selected). If so, IHS 103 may cause HMD 102 to update the LUT at block 709, and control passes to block 703. Block 710 determines that method 700 should continue (e.g., during an ongoing xR session), such that control returns to block 703. Otherwise, method 700 ends at block 711.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A Head-Mounted Device (HMD), comprising:
   a processor; and
   a memory coupled to the processor, the memory having program instructions stored thereon that, upon execution by the processor, cause the HMD to:
   receive a Look-Up Table (LUT) from an Information Handling System (IHS) coupled to the HMD, wherein the LUT comprises: a threshold distance, a first parameter, and a second parameter;
   encode a first Simultaneous Localization and Mapping (SLAM) landmark using the first parameter in response to a first distance between the first SLAM landmark and the HMD being smaller than the threshold distance;
   encode a second SLAM landmark using the second parameter in response to a second distance between the second SLAM landmark and the HMD being greater than the threshold distance; and
   transmit the encoded SLAM landmarks to the IHS.

2. The HMD of claim 1, further comprising an Infra-Red (IR) or Near-IR (NIR) camera configured to provide IR or NIR image frames to the processor.

3. The HMD of claim 1, wherein the plurality of SLAM landmarks are selected to have a Kalman Gain above a threshold value.

4. The HMD of claim 1, wherein the first parameter provides a first level of compression, and wherein the second parameter provides a second level of compression higher than the first level.

5. The HMD of claim 1, wherein the first parameter provides a first level of compression, and wherein the second parameter provides a second level of compression lower than the first level.

6. The HMD of claim 1 wherein the IHS is configured to transmit another LUT to the HMD, or modify the LUT, periodically or based upon context information.

7. The HMD of claim 6, wherein the context information comprises a type of xR application being executed.

8. The HMD of claim 6, wherein the context information comprises a gaze vector.

9. The HMD of claim 6, wherein the context information comprises data loss statistics.

10. The HMD of claim 6, wherein the context information comprises detection of a safety event at a distance smaller or greater than the threshold distance.

11. The HMD of claim 1, wherein the IHS is configured to:
decode the encoded SLAM landmarks in part, based upon the SLAM landmark's distance to the HMD; and
produce a map using the decoded SLAM landmarks.

12. A method, comprising:
providing a Look-Up Table (LUT) to a Head-Mounted Device (HMD), wherein the LUT comprises: a threshold distance, a first parameter, and a second parameter;
receiving encoded Simultaneous Localization and Mapping (SLAM) landmarks from the HMD, wherein each SLAM landmark is encoded in part, based upon the SLAM landmark's distance to the HMD;
decoding a first SLAM landmark using the first parameter in response to a first distance between the first SLAM landmark and the HMD being smaller than the threshold distance;
decoding a second SLAM landmark using the second parameter in response to a second distance between the second SLAM landmark and the HMD being greater than the threshold distance; and
producing a map using the decoded SLAM landmarks.

13. The method of claim 12, further comprising selecting the LUT among a plurality of LUTs based upon at least one of: a type of xR application, a gaze vector, or detection of a safety event.

14. The method of claim 12, further comprising selecting the LUT among a plurality of LUTs based upon a data loss metric.

15. A hardware memory of a Head-Mounted Device (HMD) wearable by a user, the hardware memory having program instructions stored thereon that, upon execution by a processor, cause the HMD to:
receive a Look-Up Table (LUT) from an Information Handling System (IHS) coupled to the HMD, wherein the LUT comprises: a threshold distance, a first parameter, and a second parameter;
encode a first Simultaneous Localization and Mapping (SLAM) landmark using the first parameter in response to a first distance between the first SLAM landmark and the HMD being smaller than the threshold distance;
encode a second SLAM landmark using the second parameter in response to a second distance between the second SLAM landmark and the HMD being greater than the threshold distance; and
transmit the encoded SLAM landmarks to the HIS.

16. The hardware memory of claim 15, wherein one of the first or second parameters provides lossless compression, and the other of the first or second parameters provides lossy compression.

* * * * *

UNITED STATES PATENT AND TRADEMARK OFFICE
CERTIFICATE OF CORRECTION

PATENT NO. : 10,816,341 B2
APPLICATION NO. : 16/258188
DATED : October 27, 2020
INVENTOR(S) : Iyer et al.

It is certified that error appears in the above-identified patent and that said Letters Patent is hereby corrected as shown below:

In the Claims

In Column 18, Line 33, Claim 15, delete "HIS" and insert -- IHS -- therefor.

Signed and Sealed this
Fifteenth Day of December, 2020

Andrei Iancu
*Director of the United States Patent and Trademark Office*